(12) United States Patent
Rueb (10) Patent No.: US 6,756,162 B2
(45) Date of Patent: Jun. 29, 2004

(54) STENCIL MASK FOR HIGH- AND ULTRAHIGH-ENERGY IMPLANTATION

(75) Inventor: Michael Rueb, Faak Am See (AT)

(73) Assignee: Infineon Technoplogies AG, Munich (DE)

(*) Notice: Subject to any disclaimer, the term of this patent is extended or adjusted under 35 U.S.C. 154(b) by 0 days.

(21) Appl. No.: 10/135,474

(22) Filed: Apr. 30, 2002

(65) Prior Publication Data

US 2002/0182517 A1 Dec. 5, 2002

(30) Foreign Application Priority Data

Apr. 30, 2001 (DE) .......................................... 101 21 181

(51) Int. Cl.[7] ................................................. G03F 9/00
(52) U.S. Cl. .......................... 430/5; 430/296; 430/396; 428/131; 428/195; 428/446
(58) Field of Search ........................... 430/5, 296, 396; 428/195, 446, 131

(56) References Cited

U.S. PATENT DOCUMENTS

| | | | | |
|---|---|---|---|---|
| 5,512,498 A | * | 4/1996 | Okamoto | 438/228 |
| 5,972,794 A | * | 10/1999 | Katakura | 438/704 |
| 6,110,331 A | * | 8/2000 | Rolfson | 204/224 M |
| 6,187,481 B1 | | 2/2001 | Rolfson | |
| 6,214,498 B1 | * | 4/2001 | Choi | 430/5 |
| 6,300,017 B1 | * | 10/2001 | Rolfson et al. | 430/5 |
| 6,468,701 B1 | * | 10/2002 | Koba | 430/5 |
| 2001/0046646 A1 | * | 11/2001 | Koba | 430/308 |

* cited by examiner

*Primary Examiner*—Stephen Stein
(74) *Attorney, Agent, or Firm*—Laurence A. Greenberg; Werner H. Stemer; Gregory L. Mayback (57) ABSTRACT

A stencil mask for high- and ultrahigh-energy implantation of semiconductor wafers has a substrate with implantation openings through which the implantation energy can be projected onto a wafer that will be implanted. The critical dimension of the implantation openings is defined in a manner dependent on the respective implantation energy.

3 Claims, 7 Drawing Sheets

PRIOR ART

| α trech (target) 90° | | | Actual: 89° | Actual: 91° | Actual: 89.5° | Actual: 90.5° |
|---|---|---|---|---|---|---|
| Implantation Energy [MeV] | Rp [µm] | Implantation Opening Radius r [µm] | Dose Increase [%] | Dose Decrease [%] | Dose Increase [%] | Dose Decrease [%] |
| 25 | 33 | 3 | 42.1 | 34.7 | 20.1 | 18.3 |
| 20 | 25 | 3 | 31.2 | 27.0 | 15.1 | 14.0 |
| 15 | 18 | 3 | 22.0 | 19.8 | 1.7 | 10.2 |
| 9 | 10 | 3 | 12.0 | 11.3 | 5.9 | 5.7 |
| 3 | 4 | 3 | 4.7 | 4.6 | 2.3 | 2.3 |
| α trech (target) 89° | | | Actual: 88° | Actual: 90° | Actual: 88.5° | Actual: 89.5° |
| 25 | 33 | 3 | 34.8 | 29.6 | 16.8 | 15.5 |
| 20 | 25 | 3 | 27.0 | 23.8 | 13.1 | 12.3 |
| 15 | 18 | 3 | 19.9 | 18.1 | 9.7 | 9.3 |
| 9 | 10 | 3 | 11.3 | 10.7 | 5.6 | 5.4 |
| 3 | 4 | 3 | 4/6 | 4.5 | 2.3 | 2.3 |

Table 1

STENCIL MASK FOR HIGH- AND ULTRAHIGH-ENERGY IMPLANTATION

BACKGROUND OF THE INVENTION

Field of the Invention

The invention relates to a stencil mask for high- and ultrahigh-energy implantation that has implantation openings in a substrate through which the implantation energy can be projected onto a wafer that will be implanted. The invention also relates to a method set up for fabricating a stencil mask of this type.

New kinds of vertical high-voltage silicon components (those that withstand voltages greater than 300 V) require vertical, pillar-type and finely patterned doping regions in the epitaxial drift zone. These so-called compensation components reduce the on resistance by up to one order of magnitude. To fabricate such vertical finely patterned doping regions, from today's standpoint high-energy implantation (up to 25 MeV boron) using silicon stencil masks appears to be the only method actually suitable in order both to expand the manufacturing capacity and to reduce the costs to a significant extent.

Figure 7:
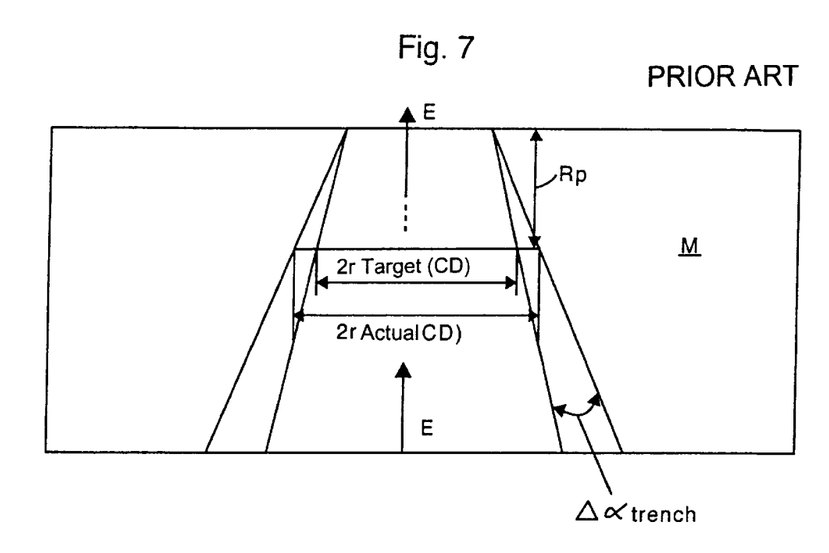
FIG. 7 is a diagrammatic cross section through a conventional stencil mask.

From a technical standpoint, fabricating suitable stencil masks for high-energy implantation is problematic since compensation components are based on the principle of balanced doping between the vertical compensation pillars and the basic doping of the epitaxial layer. Deviations in this balance by a few percent already lead to a drastic reduction in the blocking capability. Stencil masks are usually fabricated by phototechnological patterning of SOI wafers and subsequent trench etching. In this case, the trench depth for a 600 V component is approximately 35 $\mu$m. Dry-chemical etching machines which are commercially available nowadays achieve a reproducibility of the sidewall inclination of the etched trenches of about 0.5° to 1.0° on an 8 inch wafer. The conditions and the problems of such a relatively thick stencil mask M are illustrated in the form of a diagrammatic cross section in the accompanying FIG. 7. FIG. 7 illustrates how the implantation opening diameter 2r, which is to be regarded as the critical dimension CD, changes from its target value $2r_{target}$ to an actual value $2r_{ACTUAL}$ if the angle $\alpha_{trench}$ which specifies the sidewall inclination increases by the value $\Delta\alpha_{trench}$. The effective CD dimension specifies a so-called "projected range" Rp, which is equivalent to a given implantation energy E.

Figure 8:
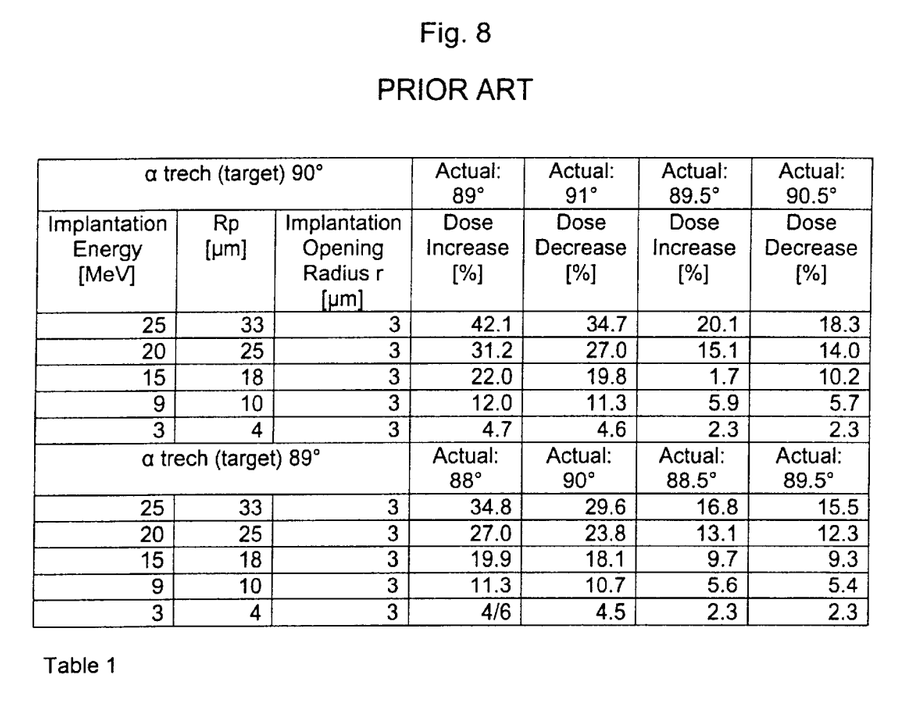
FIG. 8 is a table showing that alterations of the implantation dose depend on a variation of the target angle.

Table 1 illustrated in the accompanying FIG. 8 shows the dependence of the dose fluctuation of the implantation energy relative to the target dose in the event of deviation of the trench sidewall angle $\alpha_{trench}$ in the stencil mask M in accordance with FIG. 7.

The cumulative fluctuation (error propagation) lies in the range from ±40 to 60% of the target dose. Cumulative fluctuations of ±10 to 15% are acceptable for the device (compensation component) to be fabricated. This value already takes account of fluctuations in the resist dimension and in the doping of the epitaxial layer.

The crucial disadvantage of the stencil mask patterned in accordance with FIG. 7 is that the effective CD dimensions associated with the respective implantation energies are only controlled by the upper opening dimension of the trench and the trench angle $\alpha_{trench}$. In particular for high implantation energies and correspondingly thick stencil masks, even slight deviations from the ideal trench angle give rise to a major effect on the critical dimension CD.

To date, such compensation components have been exclusively fabricated using the so-called construction technique: First an n-doped epitaxial layer having a thickness of several micrometers is deposited on the substrate. Using a resist mask, a p-type doping is subsequently introduced by a low-energy implantation. In this connection, particular attention must be paid to the accuracy of the resist dimension of the resist mask since this is the parameter that determines the number of implanted ions, and consequently, the balance between the p-type and the n-type doping. The whole process, including epitaxial deposition, phototechnology and implantation, is repeated until the pillar height corresponding to the required withstand voltage has been constructed. The final sub-process includes a diffusion step that causes the implantation regions to diffuse together vertically.

Stencil masks are currently used primarily for ion projection lithography. In this technique, only very low-energy ions are used. The problem of fluctuation of trench angles in the case of very deep trenches does not arise in this case, since the silicon mask only has a thickness of 3.0 $\mu$m. The dimensionally accurate upper part of the trench extends merely to a depth of 150 nm.

SUMMARY OF THE INVENTION

It is accordingly an object of the invention to provide a stencil mask for high- and ultrahigh-energy implantation and a method for fabricating the stencil mask which overcome the above-mentioned disadvantages of the prior art apparatus and methods of this general type.

Following what has been said above, it is an object of the invention to provide a stencil mask that is suitable for a high- and ultrahigh-energy implantation and that significantly reduces the fluctuations shown in Table 1 (FIG. 8). Thus, it is an object of the invention to enable the development of a high-energy implantation technology for such compensation components in an expedient manner.

In order to achieve the above stated object, the invention proposes departing from the concept of the simple stencil mask in which the implantation openings are defined and formed for all energies by using a CD dimension (Critical Dimension) and a single trench etching process, and instead defining a dedicated dimensionally accurate mask for each implantation energy. In the case of this mask, the critical dimension of the implantation openings is defined in a manner dependent on the respective implantation energy. In a particular embodiment, a stencil mask is composed of a plurality of individual dimensionally accurate masks, with the result that this combined stencil mask is suitable for different implantation energies. The critical dimension of the implantation openings present in a plurality of steps or stages are in each case coordinated with the required implantation energy.

Instead of this, however, it is also possible to provide a dedicated dimensionally accurate mask for each implantation energy and to use the mask in each case for an implantation with a specific energy. In the event of a changeover of the energy, the mask is changed, too. By way of example, for a compensation component constructed from five layers, it is then necessary to fabricate five separate masks with openings whose critical dimension CD is in each case coordinated with the energy used for the implantation.

Preferably, the stencil mask is constructed on an SOI (Silicon on Insulator) base material or is composed of such an SOI base material.

The following method is particularly advantageously appropriate for fabricating a stencil mask for the high- and ultrahigh-energy implantation:

I. Providing an SOI base material with an SOI layer thickness adapted to the respective ion penetration depth, for example 5 μm for 3 MeV boron, 35 μm for 20 MeV boron.

II. Etching retrograde openings from the front side of the SOI wafer as far as the SOI oxide layer. This means that for a stencil mask, for example, for a 20 MeV implantation, the first 1.2 μm (+ safety margins) of this opening (trench) must be exact. The rest of the trench need only satisfy very undemanding requirements.

III. The mask is made transparent from the rear side by wet-chemical etching, for example.

IV. The stencil mask is used as an implantation mask, for example, by bonding or precisely positioning the mask in front of the wafer that will be implanted in such a way that the front side of the mask points in the direction of the wafer that will be implanted.

With the foregoing and other objects in view there is provided, in accordance with the invention, a stencil mask for high- and ultrahigh-energy implantation of semiconductor wafers. The stencil mask includes a substrate formed with implantation openings through which ions that will be implanted onto a wafer can be projected with a implantation energy onto the wafer. Each of the implantation openings have a diameter that is defined in a manner dependent on the implantation energy.

In accordance with an added feature of the invention, the substrate forms an individual stencil mask; and each of the implantation openings have a single diameter for the implantation energy.

In accordance with an additional feature of the invention, the substrate forms a single stencil mask with a plurality of dimensionally accurate individual stencil masks; and each of the plurality of the dimensionally accurate individual stencil masks is formed with implantation openings having diameters that are coordinated with an implantation energy of a respective implantation step of a multi-step implantation with different implantation energies.

In accordance with another feature of the invention, the substrate is constructed on an SOI base material.

In accordance with a further feature of the invention, the substrate is made from an SOI base material.

With the foregoing and other objects in view there is provided, in accordance with the invention, a method for fabricating a stencil mask for high-and ultrahigh-energy implantation that includes steps of: constructing a stencil mask having implantation openings formed therein, the openings being provided for projecting ions therethrough that will be implanted onto a wafer; and forming the implantation openings with diameters being determined by a respective implantation energy of the ions that will be projected therethrough.

In accordance with an added mode of the invention, the stencil mask is constructed by performing the steps of: forming a first oxide layer, which is accurately dimensionally prepatterned, on a silicon layer of a silicon-on-insulator wafer having a silicon-on-insulator base material by performing a step selected from the group consisting of a depositing step and a growing step, and subsequently performing a trench etching of the silicon layer using an oxide layer of the silicon-on-insulator wafer as a stop and using oxide regions on the silicon layer as dimensionally accurate hard masks.

In accordance with an additional mode of the invention, the stencil mask is constructed such that the implantation openings have a plurality of different diameters by: performing a plurality of steps that are each either a depositing step or a growing step to construct a plurality of silicon layers and a plurality of dimensionally accurately patterned oxide layers such that each one the oxide layers is located above a respective one of the silicon layers, such that each one of the oxide layers has implantation openings that are centered in relation to respective implantation openings in others of the oxide layers, and such that the diameters of the implantation openings in each respective one of the oxide layers are larger than the diameters of the implantation openings in the oxide layers below the respective one of the oxide layers. Subsequently, starting from a topmost one of the oxide layers, and stopping on the oxide layer of the silicon-on-insulator wafer, a trench etching is performed through each one of the silicon layers in which all of the patterned oxide layers act as dimensionally accurate hard masks lying one above another.

In accordance with another mode of the invention, the method includes: subsequently patterning the silicon-on-insulator wafer from a rear side of the wafer; forming large window openings by performing a step selected from the group consisting of wet-chemical etching and dry-chemical etching through the silicon layer and the oxide layer of the silicon-on insulator wafer; and providing the stencil mask with a front side that can positioned over a semiconductor wafer that will be implanted by configuring the stencil mask in a flipped position.

In accordance with a further mode of the invention, the stencil mask is constructed by: a) applying and dimensionally accurately patterning a first mask on a silicon layer of an SOI wafer, the first mask being selected from the group consisting of a hard mask and a resist mask, b) through openings in the first mask, performing a trench etching in the silicon layer of the SOI wafer, c) subsequently closing off each etched trench with a plug and after removing the first mask, leveling a surface of the silicon layer, d) performing steps a)–c) as often as necessary, and e) patterning a rear side of the SOI wafer to form large windows by performing a step selected from the group consisting of a wet-chemical etching step and a dry-chemical etching step.

In accordance with a further added mode of the invention, the stencil mask is constructed using a stepped trench etching of a silicon layer of an SOI base material in a desired target thickness, by performing the following steps: Applying and patterning a first mask on the silicon layer of the SOI wafer. The first mask is either a resist mask or a hard mask. Subsequently, forming a trench having trench walls and a trench bottom by performing a first trench etching into the silicon layer down to a first depth and applying an oxide layer to cover the trench walls and the trench bottom. Subsequently etching the oxide layer at the trench bottom to produce a dimensionally accurate opening leading to the silicon layer. Subsequently performing a second trench etching in the trench down to a second selected target depth and depositing a further oxide layer in the trench. Subsequently, performing a further spacer etching of the further oxide layer at a trench bottom. Performing a renewed trench etching as far as an SOI oxide of the SOI base material. Subsequently, patterning a wafer rear side by performing either a wet-chemical etching step or a dry-chemical etching to form large windows, and wet-chemically etching the SOI oxide and side wall oxides of the stepped trench.

Other features which are considered as characteristic for the invention are set forth in the appended claims.

Although the invention is illustrated and described herein as embodied in a stencil mask for high- and ultrahigh-energy implantation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
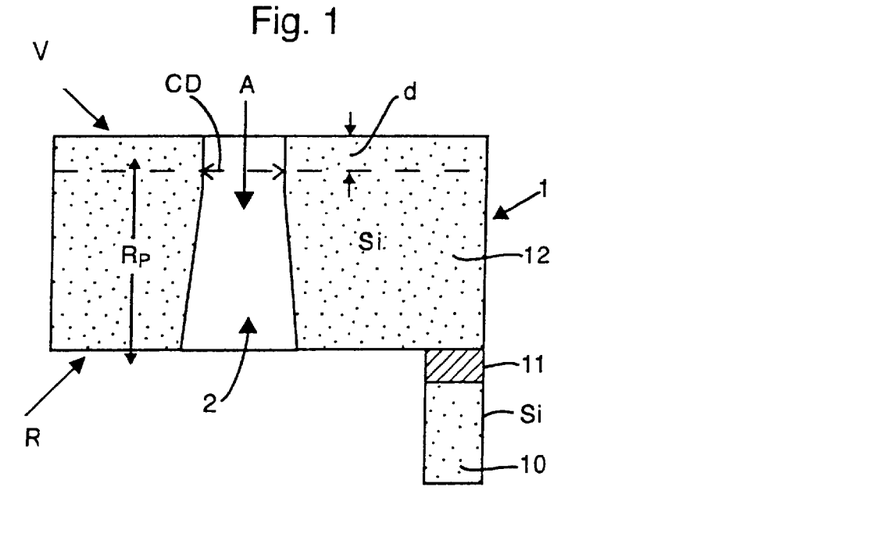
FIG. 1 is a diagrammatic cross sectional view of a first embodiment of a stencil mask for high- and ultrahigh-energy implantation.
Figure 2:
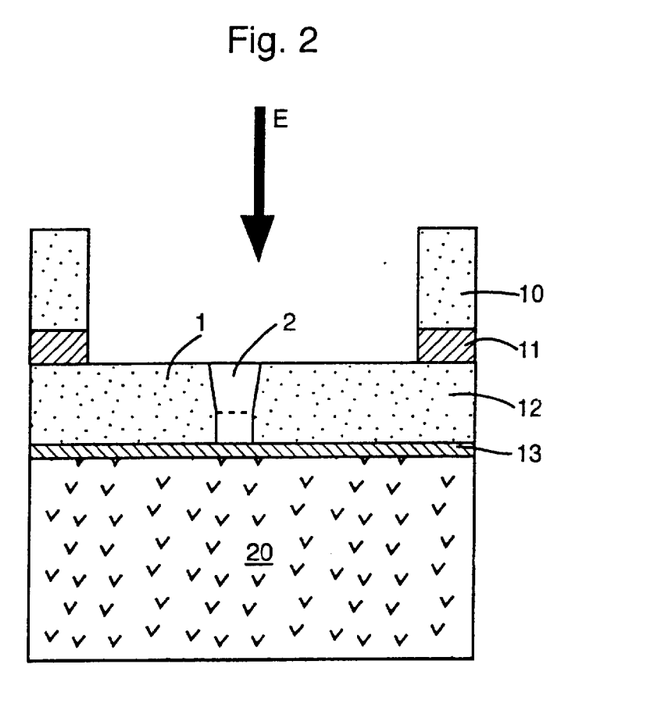
FIG. 2 is a diagrammatic cross sectional view of a stencil mask that is positioned above a device wafer during an implantation.

Referring now to the figures of the drawing in detail and first, particularly, to FIG. 1 thereof, there is shown a diagrammatic cross sectional view of a first embodiment of an inventive stencil mask 1. FIG. 2 shows the stencil mask 1 positioned above a device wafer 20. The stencil mask 1 shown in FIG. 1 is characterized by defining the critical dimension CD (diameter) of an implantation opening 2 (only one opening is shown for the purpose of simplification) in a manner dependent on a desired implantation energy. An SOI base material is used as the initial basis for fabricating the stencil mask 1. The SOI base material includes a first SI layer 10, an oxide layer 11 and a second SI layer 12, whose thickness is adapted to the respective ion penetration depth during the ion implantation of a target wafer 20 as shown in FIG. 2. This thickness is, for example, 5 $\mu$m for 3 MeV boron and 35 $\mu$m for 20 MeV boron.

During the fabrication of the stencil mask 1, first retrograde openings 2 are etched from the front side V as far as the oxide layer 11 by using a dry- or wet-etching process (arrow A). This means that the etching A has to be exactly dimensionally accurate only at the beginning (depth d). By way of example, the etched trench must be exact for d=1.2 $\mu$m for a 20 MeV implantation mask. The dimension of the rest of the trench forming the opening 2 need only satisfy very undemanding requirements. Afterward, the stencil mask 1 is made transparent from the rear side R by wet-chemical etching, for example. In other words, on the rear side R, large windows are opened in the first SI layer 10 and in the oxide layer 11 of the SOI wafer.

As shown in FIG. 2, the mask 1 is fixed as an implantation mask, for example, by bonding or by precisely positioning the mask in front of the device wafer 20. When the mask 1 is used, the front side V of the mask 1 is located above the device wafer 20 to be implanted. FIG. 2 shows a bonding layer 13 with which the stencil mask 1 is adhesively bonded on the device wafer 20. Implantation energy E is applied from above. In this case, as mentioned, the critical dimension CD, i.e. the clearance of the opening 2 at the distance d from the front side V of the mask, is defined in a manner dependent on the implantation energy E.

In a further embodiment of the inventive stencil mask, a plurality of dimensionally accurate masks whose critical dimension CD is in each case coordinated with the respective implantation energy to be used are combined to form a single stencil mask 1.

Such a combined stencil mask 1 will now be explained with reference to FIG. 3. The stencil mask 1, which is illustrated in a diagrammatic cross sectional view in FIG. 3, has an associated CD dimension CD1, CD2, CD3 and CD4 for each implantation energy, that is to say, for each projected range Rp1, Rp2, Rp3, and Rp4. CD1 is the precise opening width for an implantation with a first energy. CD2 is the precise opening width for an implantation with a second energy. CD3 is the precise opening width for an implantation with a third energy. CD4 is the precise opening width for an implantation with a fourth energy. Lying between these precisely defined openings are non-critical regions which are permitted to be subject to large fluctuations. For the implantation operation, the stencil mask shown in FIG. 3 is to be positioned, or fixed positionally accurately, with its front side V above a device wafer.

Figure 3:
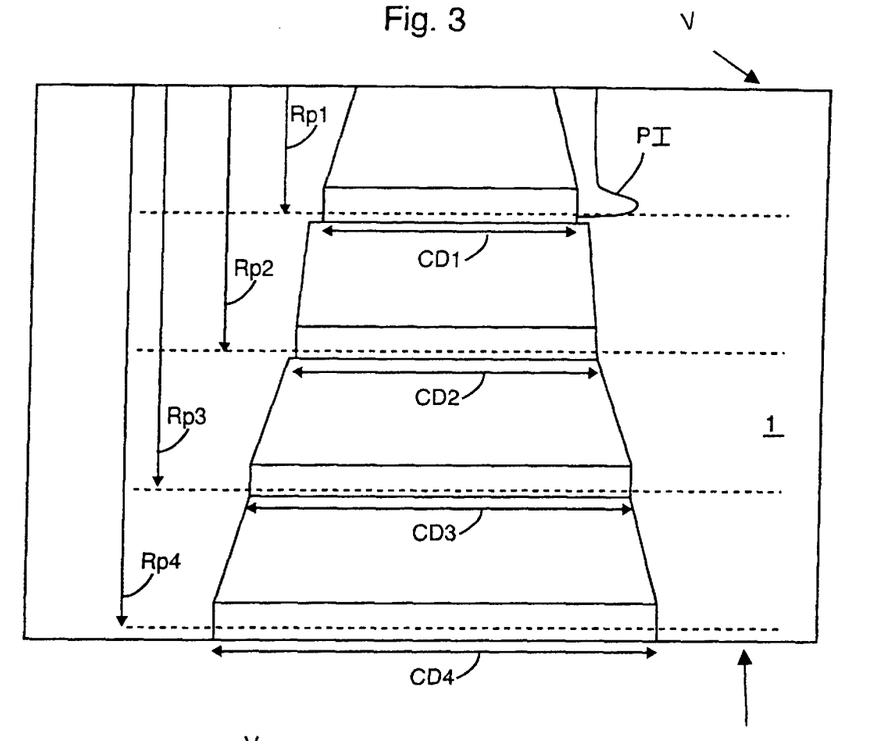
FIG. 3 is a diagrammatic cross sectional view of a second embodiment of a stencil mask.

FIG. 3 also illustrates that the implantation profile $P_I$ of a high-energy implantation is configured such that the majority of the implanted dose lies in the region of the projected range Rp.

The fourth column, +/−2 sigma, of table 2 shown below specifies the depth region in which 95.4% of the implanted dose is deposited. This is then, the distance at which the dimensional accuracy of the respective implantation opening must be ensured. If this is the case, then the abovementioned 95.4% of the dose has been implanted exactly.

TABLE 2

The projected range Rp and the first moment of the ion distribution after the implantation with different energies

| | Rp vertical [$\mu$m] | Delta Rp [$\mu$m] | +/−2 Sigma [$\mu$m] |
|---|---|---|---|
| 3 MeV | 3.7 | 0.2 | 0.8 |
| 9 MeV | 9.9 | 0.25 | 1.0 |
| 15 MeV | 17.4 | 0.25 | 1.0 |
| 20 MeV | 24.8 | 0.30 | 1.2 |

The accuracy can be increased further by appropriate measures (expanding the exact region). The structures proposed must additionally be adapted to the experimental specifications with safety margins at different locations. It is important in this connection to exactly know the penetration depth, or even better to know the exact implantation profile of the ions before fabricating the mask. The dimensionally accurate opening must, of course, be incorporated in the correct overall depth.

The combined stencil mask which is shown in FIG. 3 and described above has the following advantages:

shallow etchings with a depth in the range from one to a few $\mu$m can be fabricated on the wafer that is used for fabricating the stencil mask, with very small fluctuations with regard to the critical dimension CD and the trench angle. Consequently, compared with conventional stencil masks with deep trenches, a significant improvement is produced in the overall accuracy on the mask from the center to the edge; and for the same reason, the fluctuation from mask to mask is likewise reduced.

In the case of conventional stencil masks, there are in principle only two parameters available during the fabrication of the mask. They are the CD dimension of the upper opening and the trench angle. However, it is precisely the trench angle that is essentially pre-determined by the etching chemistry and can be set in a defined manner only with very great difficulty. An added difficulty is the fact that exact control of the trench angle over large depths is possible only with the low accuracy of greater than ±0.5°.

Exemplary embodiments of a method used for fabricating a stencil mask according to the invention are described below.

FIGS. 4A–4E show method steps of a first exemplary embodiment of a method for fabricating a stencil mask 1, for example, the mask that has been described above with reference to FIG. 3.

Figure 4A:
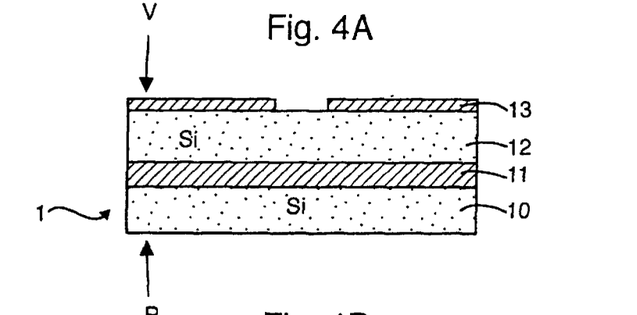
FIGS. 4A–4E are cross-sectional illustrations for explaining a first exemplary embodiment of a method for fabricating a stencil mask.

In accordance with FIG. 4A, the starting point is formed by an SOI base material including a first SI layer 10, an oxide layer 11 and a second SI layer 12 in this order. An oxide layer 13 is deposited above the upper (second) SI layer 12 and patterned dimensionally accurately. "Dimensionally accurately" means that the width of the patterned opening of the oxide layer 13 defines a first critical dimension (CD1) (also see FIG. 3, for example).

Figure 4B:
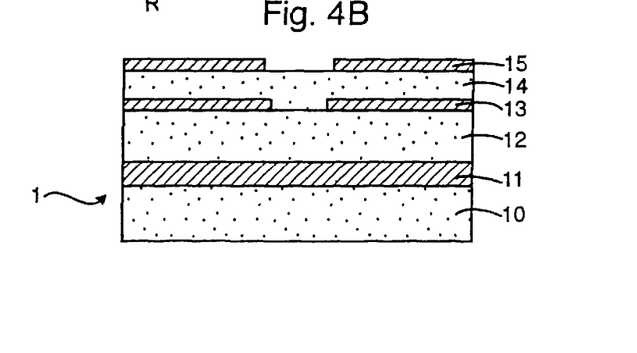

In accordance with FIG. 4B, a further SI layer 14 is applied on the oxide layer 13 and a further oxide layer 15 is applied above the SI layer 14. The further oxide layer 15, for its part, is patterned dimensionally accurately such that the width of its opening specifies a second critical dimension (CD2).

Figure 4C:
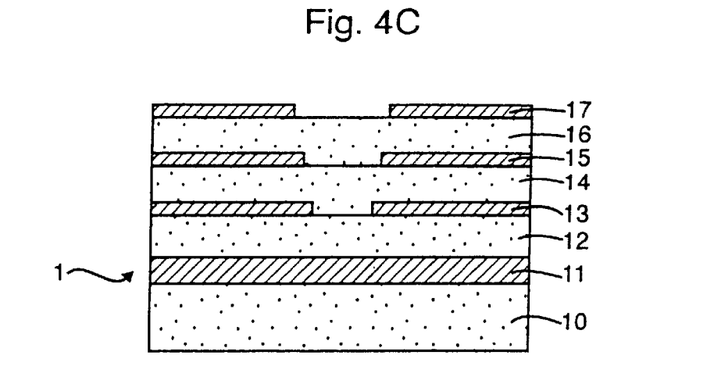

In accordance with FIG. 4C, the step illustrated in FIG. 4B is repeated, a further SI layer 16 is deposited and a third oxide layer 17 is deposited above the SI layer and is patterned dimensionally accurately in such a way that the width of the opening formed in the oxide layer 17 defines a third critical dimension CD3.

It should be noted here that the respective projected ranges are defined by the thicknesses of the respective SI layers 12, 14, 16.

Figure 4D:
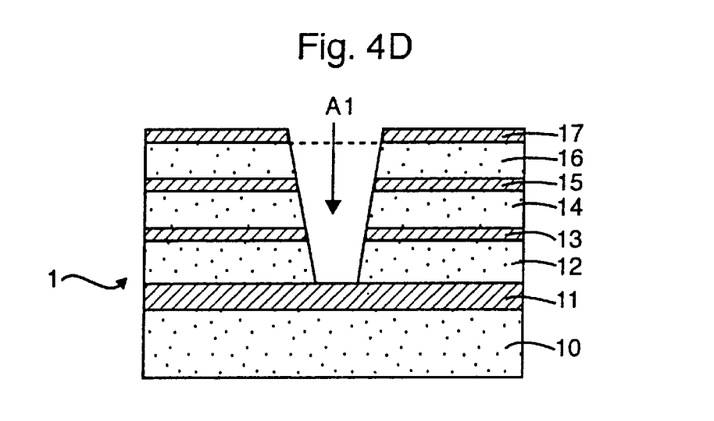

In accordance with FIG. 4D, a silicon etching (trench etching) is then effected, during which the oxide regions 13, 15, 17 in each plane serve as dimensionally accurate hard masks, as far as the etching stop by the oxide layer 11 of the SOI base material (arrow A1).

Figure 4E:
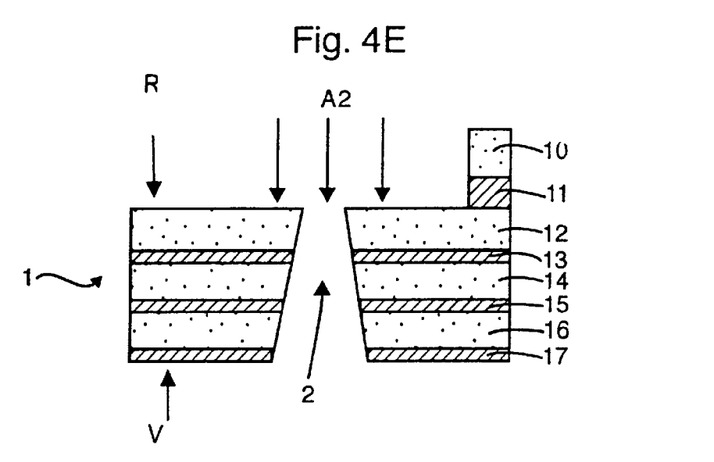

In accordance with FIG. 4E, the stencil mask 1 is completed by patterning the rear side R of the wafer. In this case, large windows are opened by wet-chemical or dry-chemical etching (silicon and oxide) (illustrated by the arrows A2), thereby finishing the fabrication of the implantation opening 2 of the stencil mask 1. The structure shown in FIG. 4E, that is to say the stencil mask 1, is flipped, that is to say brought to a position in which its rear side R is positioned above a device wafer (not shown) and used as an implantation mask.

Figure 5A:
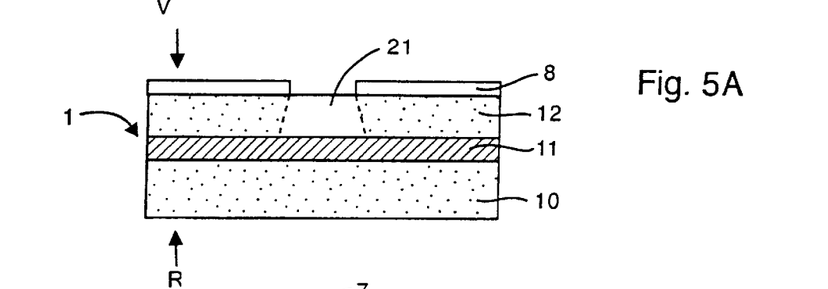
FIGS. 5A–5E are cross-sectional illustrations through an SOI wafer for explaining a second exemplary embodiment of a method for fabricating a stencil mask.

FIGS. 5A–5E show method steps of a construction method for fabricating a stencil mask 1. This method is an alternative to the construction method shown in FIGS. 4A–4E. Once again an SOI base material including a first SI layer 10, an oxide layer 11 and a second SI layer 12 serves as the starting wafer for fabricating a stencil mask. The surface of the upper, that is to say second, SI layer 12 is covered with a resist or hard mask 8 as shown in FIG. 5A and the mask is patterned dimensionally accurately. Here again, dimensionally accurately means that the dimension of the opening width of the patterned resist or hard mask 8 complies with a critical dimension for the implantation opening, for example CD3. Afterward, a downwardly widening first trench 21 is etched through the opening of the resist or hard mask 8.

Figure 5B:
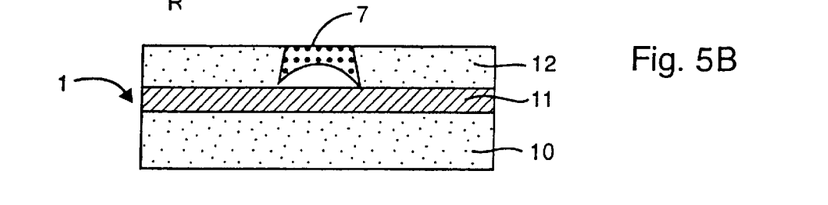

In accordance with FIG. 5B, the first trench 21 is closed with a plug 7, for example a BPSG plug. The hard or resist mask 8 is removed, and the surface of the trench 21 that is closed with the plug 7 and the surface of the silicon layer 12 are planarized. It should be mentioned that planar surfaces can be obtained automatically with the BPSG plug technique given suitable process control, so that the planarization step can then be omitted.

Figure 5C:
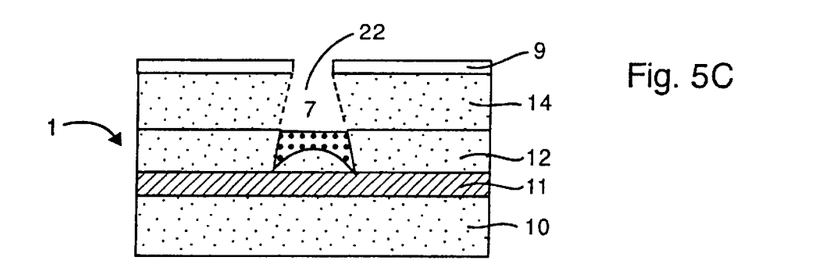

In accordance with FIG. 5C, a further SI layer 14 is deposited or grown on the upper silicon layer 12 of the SOI base material. The further SI layer is then covered with a resist or hard mask 9 that is subsequently patterned dimensionally accurately. Dimensionally accurately in this case means that the opening width of the opening formed in the resist or hard mask 9 must comply with a second critical dimension, for example, CD2 of the implantation opening of the stencil mask. A second downwardly widening trench 22 is then etched, in which the plug 7 serves as an etching stop. The steps shown in FIGS. 5A to 5C can be repeated, as a result of which further layers with further plugs can be fabricated.

Figure 5D:
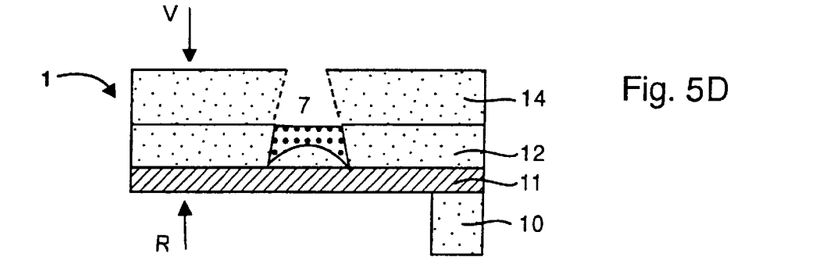

Afterward, in accordance with FIG. 5D, the rear side R of the wafer is patterned using a wet- or dry-chemical silicon etching, as a result of which large windows are formed in the bottommost SOI silicon layer 10.

Figure 5E:
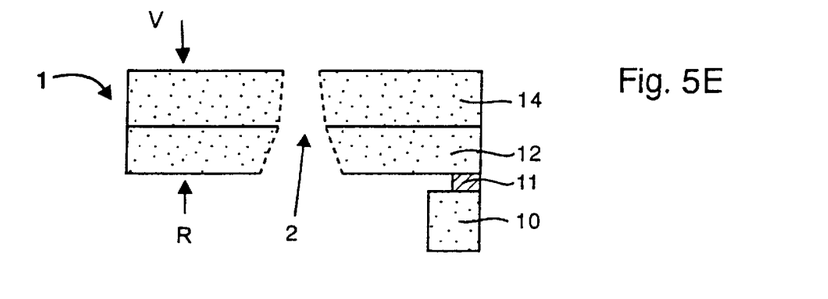

In accordance with FIG. 5E, the SOI oxide 11 and the plug 7 or the plugs are then removed from the rear side using a wet-chemical oxide etching, as a result of which the implantation opening 2 is completed. For its use for a high- or ultrahigh-energy implantation, the stencil mask 1 illustrated in FIG. 5E is positioned, or fixed positionally accurately, with its front side V above a device wafer.

The alternative construction methods for a stencil mask that are illustrated in FIGS. 4A–4E and 5A–5E and described above use repeated silicon depositions in conjunction with repeated dimensionally accurate oxide or silicon etchings. The mask is constructed step by step on an SOI base material.

Assuming a reasonable service life, the stencil masks are not cost-limited. That is to say, it is possible to permit significantly more costly processes than in the case of a product wafer process since the masks are reused very often and the fabrication costs are thus distributed uniformly between all of the wafers fabricated using this mask.

For reasons of thermal stability, preference should be given to fabrication variants that do not require mixing of materials in the case of the finished mask. That is to say that masks made of pure silicon, as in the exemplary embodiment shown in FIGS. 5A–5E and as described above, are to be preferred over those that include layer sequences of oxide and silicon.

In the case of the second exemplary embodiment of the construction method that is illustrated in FIGS. 5A–5E and described above, the deposited silicon can also be grown epitaxially—at a low temperature. This likewise has considerable advantages for the thermal stability of the stencil mask fabricated. Disturbances to the crystallinity in the region of the oxide plugs play only an insignificant part since these regions are etched again in the next construction step.

The third exemplary embodiment of a fabrication method for a stencil mask according to the invention as described below with reference to FIGS. 6A–6D does not use a construction technique of the kind used in the exemplary embodiments described with reference to FIGS. 4A–4E and 5A–5E, but rather uses a stepped trench etching. The starting material used is once again an SOI wafer including a first silicon layer 10, an oxide layer 11 and a second silicon layer 12. In this case, the method of stepped trench etching corresponding to the third exemplary embodiment differs from the construction methods described above in principle by the fact that the second silicon layer 12 already has the target thickness at the beginning of the fabrication process for the stencil mask.

Figure 6A:
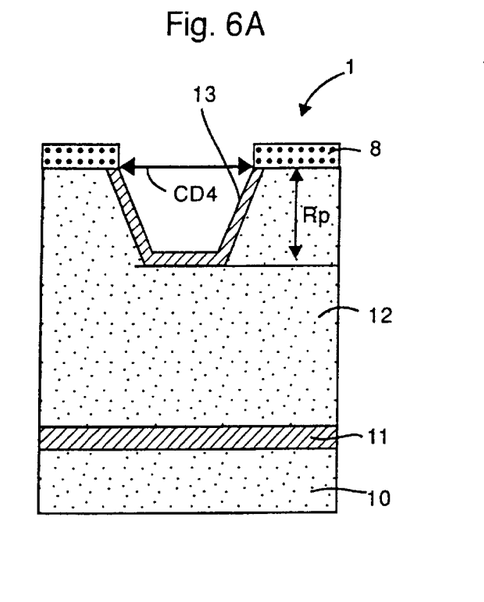
FIGS. 6A–6D are cross-sectional illustrations through an SOI wafer for explaining individual steps of a third exemplary embodiment of a method for fabricating a stencil mask.
Figure 6B:
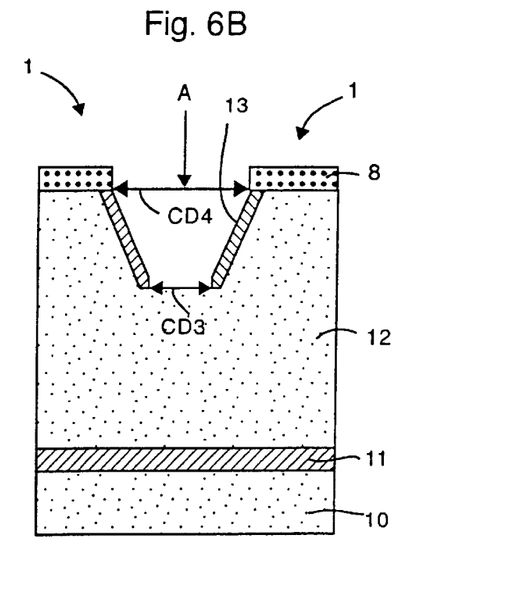

In accordance with FIG. 6A, a resist or hard mask 8 is applied above the second SI layer 12 and is patterned dimensionally accurately. The opening width has the critical dimension CD4. A trench etching down to a first target depth Rp is subsequently effected. An oxide layer 13 is subsequently deposited into the trench. The oxide layer covers the bottom and the sidewalls of the trench. The deposited oxide layer must be so thick that, after an oxide etching (arrow A) which is illustrated in FIG. 6B and is comparable to a spacer etching, the required dimensionally accurate opening remains in accordance with the critical dimension CD3.

Figure 6C:
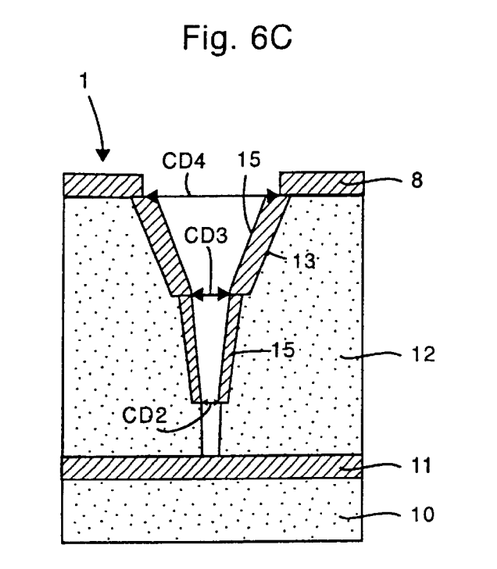

Afterward, in accordance with FIG. 6C, a further trench etching down to a second target depth is carried out, a further suitable oxide layer 15 is deposited and that section of the second oxide layer 15 which lies at the bottom of the second trench is etched by a spacer etching, thereby producing a dimensionally accurate opening in accordance with the critical dimension CD2. A renewed trench etching with a stop on the SOI oxide 11 is subsequently effected. Depending on the required mask thickness of the stencil mask 1 and the required number of stepped critical dimensions CD, this process must be repeated a number of times.

Figure 6D:
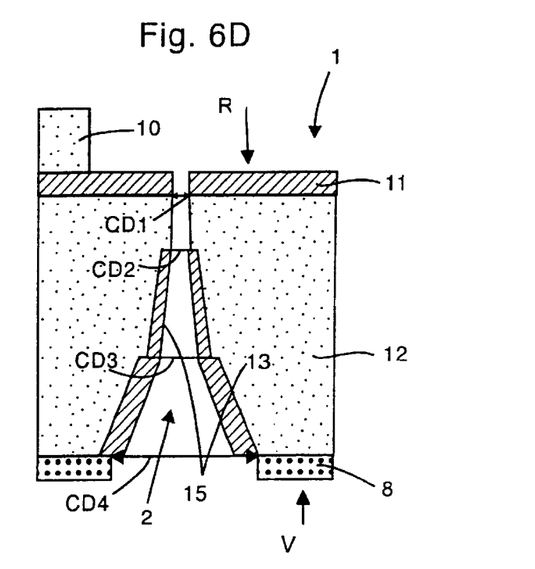

In accordance with FIG. 6D, the wafer rear side R is patterned by wet- or dry-chemical etching with large windows being opened. The SOI oxide layer 11 and the sidewall oxides 13, 15 are subsequently etched wet-chemically.

Consequently, by using the stepped trench etching described, a stencil mask 1 with critical dimensions CD4, CD3, CD2 and CD1 which taper stepwise is fabricated, as is also illustrated in FIG. 3, for example. The special feature of the method illustrated in FIGS. 6A–6D just described is that the dimensional accuracy is set at the required locations not by using phototechnology or the like, but by depositions or thermal oxidation. In other words, in this case it is particularly important to accurately determine CD dimensions in deep trenches and afterward, building on these measurement results, to be able to apply an auxiliary layer of exact thickness in these trenches. A simpler variant of this method would consist in using base material with incorporated etching stops, for example, in the form of thin oxide layers. However, in principle this again constitutes a type of construction technique, and consequently it is no longer necessary to effect the costly setting of the dimensional accuracy by using a defined deposition at this point.

Quite generally, a retrograde trench profile is preferred in all of the embodiments and exemplary embodiments. Other embodiments inevitably result if a "tapered" trench profile is required. The embodiments shown or the concept of stepwise dimensional accuracy can also be applied to other materials, for example, SIC or metals.

I claim:

1. A stencil mask for high- and ultrahigh-energy implantation of semiconductor wafers, comprising:

a substrate forming a single stencil mask with more than two dimensionally accurate individual stencil masks;

each of said dimensionally accurate individual stencil masks formed with implantation openings through which ions that will be implanted onto a wafer can be projected with a implantation energy onto the wafer;

each of said implantation openings having a region with a diameter dependent on and coordinated with an implantation energy of a respective implantation step of a multi-step implantation with different implantation energies; and each of said implantation openings formed with a region having a non-critical diameter.

2. The stencil mask according to claim 1, wherein said substrate is constructed on an SOI base material.

3. The stencil mask according to claim 1, wherein said substrate is made from an SOI base material.

* * * * *